United States Patent
Maeda et al.

(10) Patent No.: US 12,080,679 B2
(45) Date of Patent: Sep. 3, 2024

(54) BONDING APPARATUS AND ALIGNMENT METHOD

(71) Applicant: SHINKAWA LTD., Tokyo (JP)

(72) Inventors: Toru Maeda, Tokyo (JP); Osamu Kakutani, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 18/010,458

(22) PCT Filed: Aug. 26, 2021

(86) PCT No.: PCT/JP2021/031360
§ 371 (c)(1),
(2) Date: Dec. 15, 2022

(87) PCT Pub. No.: WO2023/026430
PCT Pub. Date: Mar. 2, 2023

(65) Prior Publication Data
US 2024/0105673 A1 Mar. 28, 2024

(51) Int. Cl.
*B23K 20/00* (2006.01)
*B23K 20/10* (2006.01)
(Continued)

(52) U.S. Cl.
CPC ............ *H01L 24/78* (2013.01); *B23K 20/004* (2013.01); *B23K 20/005* (2013.01);
(Continued)

(58) Field of Classification Search
CPC ........... H01L 24/78; H01L 2224/78621; H01L 2224/78701; H01L 2224/78753;
(Continued)

(56) References Cited

U.S. PATENT DOCUMENTS

| 3,774,834 | A | * | 11/1973 | Holler | ............... H01L 21/67144 |
| | | | | | 29/827 |
| 5,249,726 | A | | 10/1993 | Sato | |
| 6,595,400 | B2 | | 7/2003 | Terakado et al. | |
| 2008/0083818 | A1 | * | 4/2008 | Best | ....................... B23K 31/02 |
| | | | | | 228/103 |

(Continued)

FOREIGN PATENT DOCUMENTS

| CN | 103262229 A | * | 8/2013 | ............... B23K 3/08 |
| CN | 106873166 A | * | 6/2017 | ......... B23K 26/0006 |

(Continued)

OTHER PUBLICATIONS

"International Search Report (Form PCT/ISA/210) of PCT/JP2021/031360," mailed on Nov. 9, 2021, pp.1-3.

*Primary Examiner* — Kiley S Stoner
(74) *Attorney, Agent, or Firm* — JCIPRNET

(57) ABSTRACT

A bonding apparatus includes: a clamper able to clamp a wire between a pair of arms; a horn, in which a first through hole able to hold a capillary, and a second through hole adjacent to the first through hole and penetrating the horn in an up-down direction are further formed; and a bonding stage able to carry a workpiece. An alignment method for aligning a horn and a damper of a bonding apparatus with each other includes: disposing a mirror surface to be parallel to a bonding stage; aligning a mirror image of a second through hole reflected on the mirror surface with a center of the second through hole when the mirror surface is viewed through the second through hole; and aligning the damper based on a position of the mirror image and the horn.

4 Claims, 6 Drawing Sheets

(51) Int. Cl.
*H01L 23/00* (2006.01)
*B23K 101/40* (2006.01)

(52) U.S. Cl.
CPC ........ *B23K 20/106* (2013.01); *B23K 2101/40* (2018.08); *H01L 2224/78621* (2013.01); *H01L 2224/78701* (2013.01); *H01L 2224/78753* (2013.01)

(58) Field of Classification Search
CPC ..... H01L 24/85; H01L 2224/78; H01L 21/60; H01L 23/00; H01L 2224/78301; H01L 2224/78705; H01L 2224/78801; H01L 2224/85169; B23K 20/004; B23K 20/106; B23K 2101/40; B23K 20/005; B23K 20/007
USPC ...................................... 228/4.5, 180.5, 904
See application file for complete search history.

(56) References Cited

U.S. PATENT DOCUMENTS

| | | | | |
|---|---|---|---|---|
| 2021/0178512 A1* | 6/2021 | Nomaru | ............... | B23K 26/359 |
| 2021/0242061 A1* | 8/2021 | Kojima | .............. | B23K 26/0853 |
| 2021/0402511 A1* | 12/2021 | Kojima | .............. | B23K 26/0853 |
| 2022/0118547 A1* | 4/2022 | Ohkubo | ............. | B23K 26/0853 |

FOREIGN PATENT DOCUMENTS

| | | | | | |
|---|---|---|---|---|---|
| JP | H0521532 | | 1/1993 | | |
| JP | H1064939 | | 3/1998 | | |
| JP | H1187395 A | * | 3/1999 | | |
| JP | 2002064118 | | 2/2002 | | |
| JP | 3715942 B2 | * | 11/2005 | ............ | H01L 24/78 |
| JP | 2006019475 A | * | 1/2006 | ............ | H01L 24/78 |
| WO | WO-2016103886 A1 | * | 6/2016 | ........... | B23K 20/002 |

* cited by examiner

BONDING APPARATUS AND ALIGNMENT METHOD

CROSS-REFERENCE TO RELATED APPLICATION

This application is a 371 application of the International PCT application serial no. PCT/JP2021/031360, filed on Aug. 26, 2021. The entirety of the above-mentioned patent application is hereby incorporated by reference herein and made a part of this specification.

TECHNICAL FIELD

The present invention relates to an alignment method for aligning a horn and a clamper of a bonding apparatus with each other.

RELATED ART

A bonding apparatus is used in a post-process in semiconductor manufacturing and connects electrodes of an IC chip and a lead frame with a metal wire. The bonding apparatus includes: a capillary, performing thermocompression bonding on the wire by ultrasonic waves; a horn, applying the ultrasonic waves to the capillary; and a clamper, gripping the wire to be supplied to the capillary (see, for example, Patent Document 1).

PRIOR-ART DOCUMENTS

Patent Documents

Patent Document 1: Japanese Patent Laid-Open No. 2002-064118

SUMMARY OF THE INVENTION

Problems to be Solved by the Invention

The clamper is disposed to grip the wire on an axis of the capillary. The wire such as a gold wire used for bonding is soft and is therefore likely to be damaged. When the center of the clamper is off the axis of the capillary, there is a risk that the clamper or the capillary may scratch the wire and damage a surface of the wire. Since the capillary is held by the horn, it is important to accurately align the clamper with the horn. However, accurate alignment takes time, leading to a heavy burden on an operator. Since the alignment depends on the skill of the operator, there is a risk that positioning accuracy may vary.

Accordingly, an object of the present invention is to provide an alignment method in which a clamper of a bonding apparatus can be accurately aligned with a horn of the bonding apparatus.

Means for Solving the Problems

An alignment method according to one aspect of the present invention is an alignment method for aligning a horn and a clamper of a bonding apparatus with each other. The bonding apparatus includes: the clamper, able to clamp a wire between a pair of arms; the horn, in which a first through hole able to hold a bonding tool, and a second through hole adjacent to the first through hole and penetrating the horn in an up-down direction are further formed; and a bonding stage, able to carry a workpiece. The alignment method includes the following. A mirror surface is disposed to be parallel to the bonding stage. A mirror image of the second through hole reflected on the mirror surface is aligned with a center of the second through hole when the mirror surface is viewed through the second through hole. The clamper is aligned based on a position of the mirror image and the horn.

A bonding apparatus according to another aspect of the present invention includes: a clamper, able to clamp a wire between a pair of arms; a horn, in which a first through hole able to hold a bonding tool, and a second through hole adjacent to the first through hole and penetrating the horn in an up-down direction are further formed; a bonding stage, able to carry a workpiece; and a control part, performing alignment between the horn and the clamper. The control part aligns a mirror image of the second through hole reflected on a mirror surface with a center of the second through hole when the mirror surface is viewed through the second through hole, the mirror surface being disposed to be parallel to the bonding stage. The control part aligns the clamper based on a position of the mirror image and the horn.

According to these aspects, in a direction perpendicular to the bonding stage, since the clamper is moved while the mirror image of the second through hole reflected on the mirror surface is aligned with the center of the second through hole, the horn and the clamper can be accurately aligned with each other.

In the above aspect, aligning the mirror image may include moving a viewpoint to a position where the mirror image is seen in the center of the second through hole. Aligning the clamper may include moving the clamper so that, when viewed from the viewpoint, a symmetry plane of the clamper that is equidistant from each of the pair of arms overlaps a symmetry plane of the horn that bisects the first through hole and the second through hole.

According to this aspect, in the direction perpendicular to the bonding stage, the mirror image of the second through hole reflected on the mirror surface, the second through hole, and the viewpoint viewing the foregoing are arranged in a row. Since the symmetry plane of the clamper is moved so as to overlap the symmetry plane of the horn while maintaining this positional relationship, the horn and the clamper can be accurately aligned with each other.

In the above aspect, an opening of the second through hole has a teardrop shape having a vertex where a curvature is maximum. Aligning the clamper may include moving the clamper so that the symmetry plane of the clamper overlaps the vertex when viewed from the viewpoint.

According to this aspect, since the vertex having a pointed shape where the curvature is maximum is provided, it is easy to visually recognize where the symmetry plane of the horn is as compared with a case where the opening of the second through hole is circular and has no vertex. The horn and the clamper can be relatively accurately aligned with each other with the vertex as a mark.

Effects of the Invention

According to the present invention, an alignment method can be provided in which a clamper of a bonding apparatus can be accurately aligned with a horn of the bonding apparatus.

DESCRIPTION OF THE EMBODIMENTS

Figure 1:
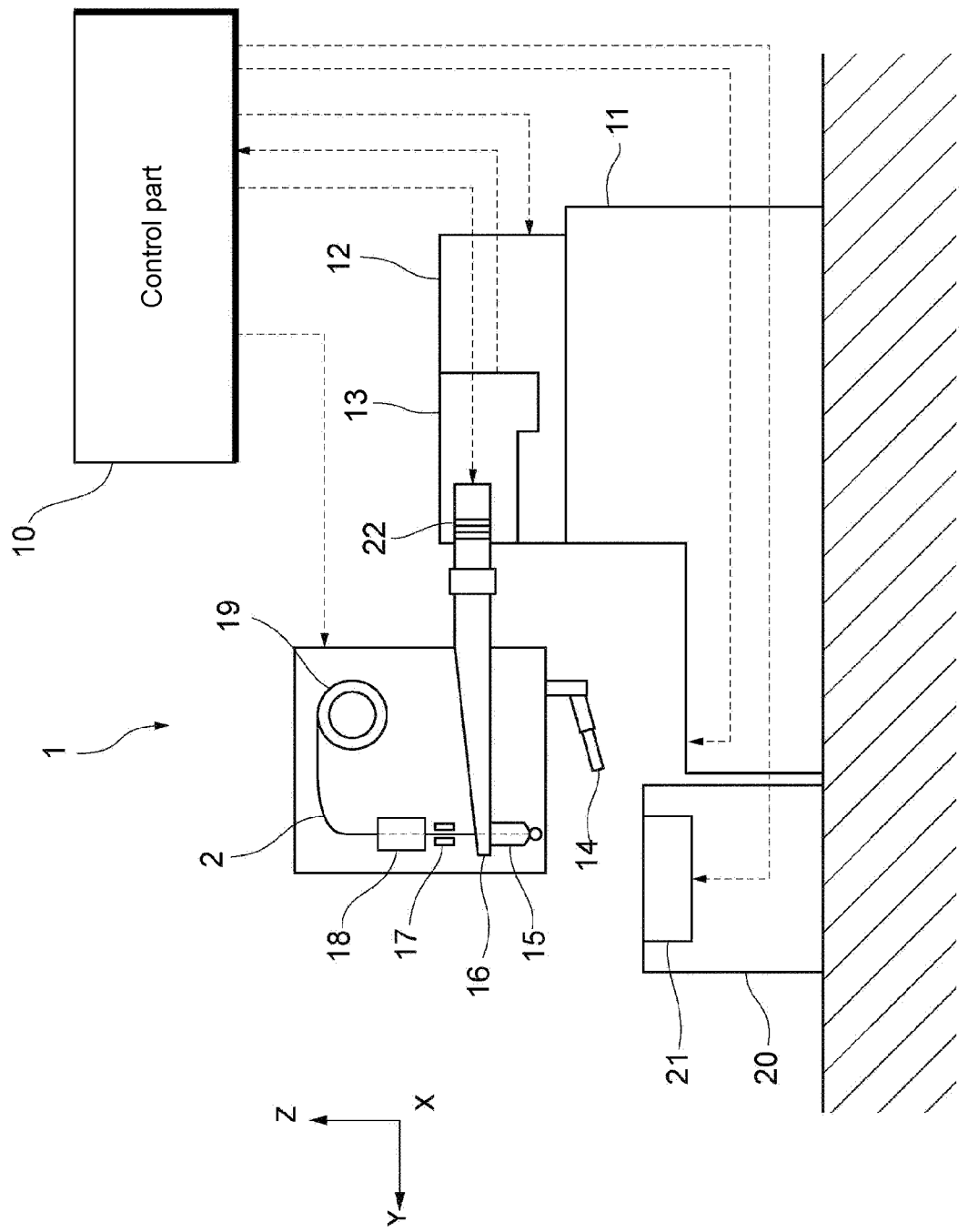
FIG. 1 is a side view schematically showing a configuration of a bonding apparatus.

Preferred embodiments of the present invention are described with reference to the accompanying drawings. In each figure, those with the same reference numerals have the same or similar configurations. The present invention will be hereinafter described in detail with reference to the drawings.

One embodiment of the present invention provides an alignment method for aligning a horn 16 and a clamper 17 of a bonding apparatus 1 with each other. FIG. 1 is a side view schematically showing a configuration of the bonding apparatus 1. In the illustrated example, the bonding apparatus 1 includes a base 11, an XY table 12, a bonding head 13, a torch electrode 14, a capillary 15, the horn 16, the clamper 17, a wire tensioner 18, a rotary spool 19, a bonding stage 20, a heater 21, a control part 10, and the like.

In the following embodiments, a plane parallel to a semiconductor element or a lead frame to be bonded is taken as an XY plane, and a direction perpendicular to the XY plane is taken as a Z-axis direction. The Z-axis direction is an up-down direction. The up-down direction is not limited to a vertical direction in a strict sense, and may be slightly tilted from the vertical direction. A tip position of the capillary 15 can be specified by spatial coordinates (X, Y, Z) represented by an X coordinate, a Y coordinate, and a Z coordinate.

The base 11 is configured to slidably carry the XY table 12. The XY table 12 is a moving device able to move the capillary 15 to a predetermined position on the XY plane based on a drive signal from the control part 10. The bonding head 13 is a moving device held to be movable in the Z-axis direction so that a tip of the capillary 15 attached to a tip portion of the horn 16 contacts or is separated from a surface of a workpiece such as a substrate based on the drive signal from the control part 10.

The horn 16 is a rod-shaped member composed of an end portion, a flange portion, a horn portion, and the tip portion from the end to the tip. An ultrasonic vibrator 22 that vibrates in response to the drive signal from the control part 10 is disposed on the end portion. The flange portion is attached to so as to resonate with the bonding head 13 in a position serving as a node of ultrasonic vibration. The horn portion is an arm extending longer than a diameter of the end portion, and has a structure that increases the amplitude of vibration caused by the ultrasonic vibrator 22 and transmits the vibration to the tip portion. The tip portion is configured as an attachment portion that replaceably holds the capillary 15. The tip portion of the horn 16 will be described in detail later with reference to FIG. 2 to FIG. 6.

The horn 16 has a resonance structure that resonates with vibration of the ultrasonic vibrator 22 as a whole, and is configured into a structure in which the ultrasonic vibrator 22 and the flange portion are located at a vibration node and the capillary 15 is located at a vibration antinode at the time of resonance. By these configurations, the horn 16 functions as a transducer that converts an electrical drive signal into mechanical vibration.

The capillary 15 is an example of a bonding tool used for bonding. The capillary 15 is formed in a tubular shape, and a wire 2 used for bonding is inserted therethrough. The capillary 15 is replaceably attached to the tip portion of the horn 16. The clamper 17 includes a pair of arms 17L and 17R that open and close based on a signal from the control part 10, and is able to grip or release the wire 2 at an arbitrary timing.

The wire tensioner 18 has the wire 2 inserted therethrough and freely changes the tension on the wire 2 based on a control signal of the control part 10, thereby being able to apply appropriate tension to the wire 2 during bonding. The rotary spool 19 replaceably holds a reel around which the wire 2 is wound, and is configured to send out the wire 2 according to the tension applied from the wire tensioner 18. A material of the wire 2 is selected on account of easy processing and low electrical resistance. Gold (Au), silver (Ag), aluminum (Al), copper (Cu) or the like is usually used.

The torch electrode 14 is connected to a high voltage power supply (not shown) via a discharge stabilizing resistor, and generates a spark (discharge) based on the control signal from the control part 10. Due to heat of the spark, a free air ball can be formed at a hanging end of the wire 2 sent out from the tip of the capillary 15. The bonding stage 20 is a processing table able to carry a semiconductor chip or a lead frame to be bonded. The heater 21 is embedded in an upper surface of the bonding stage 20, and is configured to be able to heat the semiconductor chip or the lead frame to a temperature suitable for bonding. The upper surface of the bonding stage 20 is formed parallel to the aforesaid XY plane.

The control part 10 is configured to be able to output various control signals for controlling the bonding apparatus 1 based on a predetermined software program. The configuration of the bonding apparatus 1 is not limited to the illustrated example. For example, a moving device for moving in the X-axis direction and/or the Y-axis direction may be provided on the bonding stage 20 side. Alternatively, the moving device may be provided on both the XY table 12 side and the bonding stage 20 side.

Figure 2:
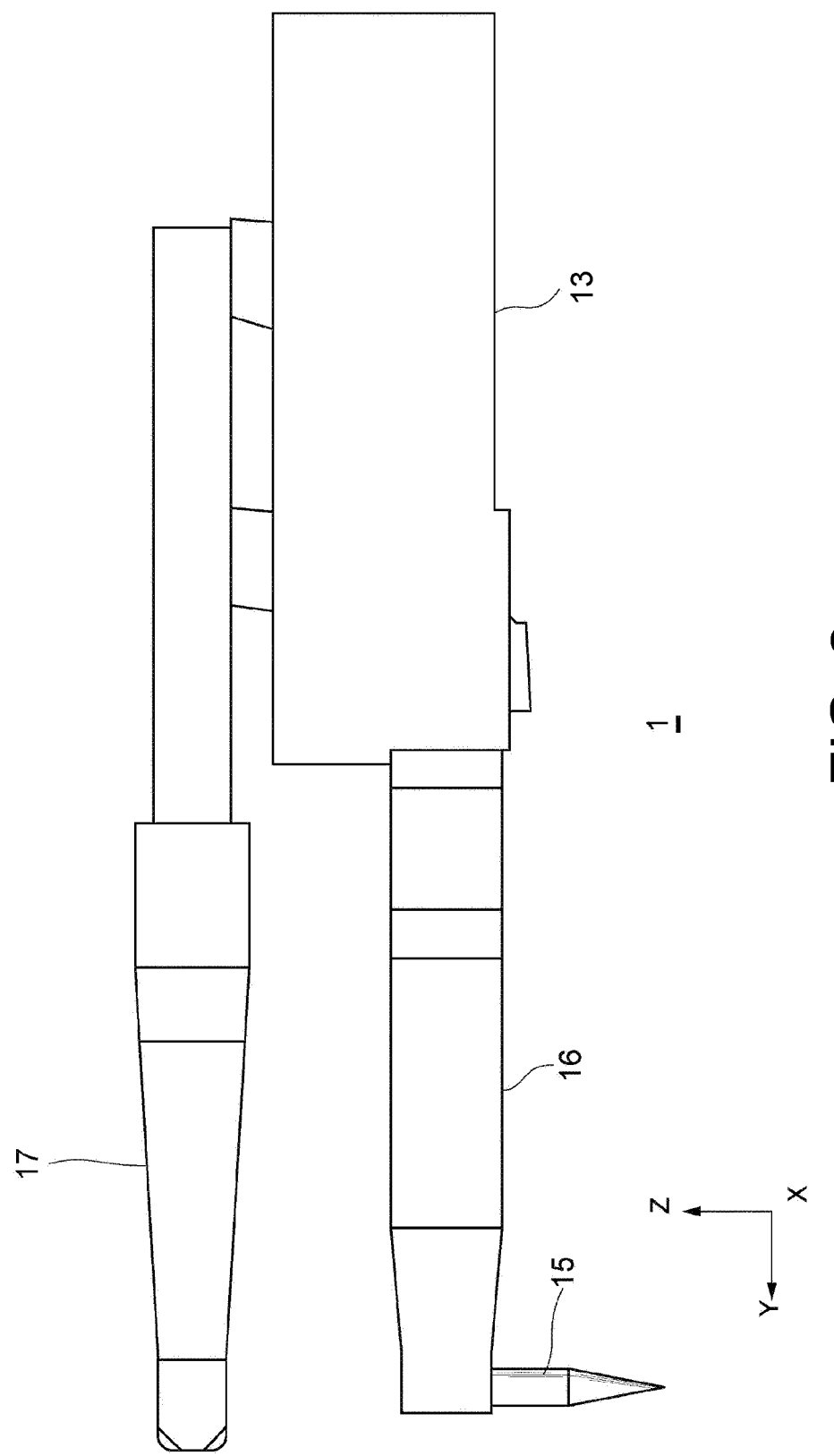
FIG. 2 is a side view showing an example of a horn and a clamper shown in FIG. 1.

FIG. 2 is a side view showing an example of the horn 16 and the clamper 17 shown in FIG. 1. As shown in FIG. 2, the horn 16 is disposed so that a longitudinal direction thereof is along a horizontal direction.

Figure 3:
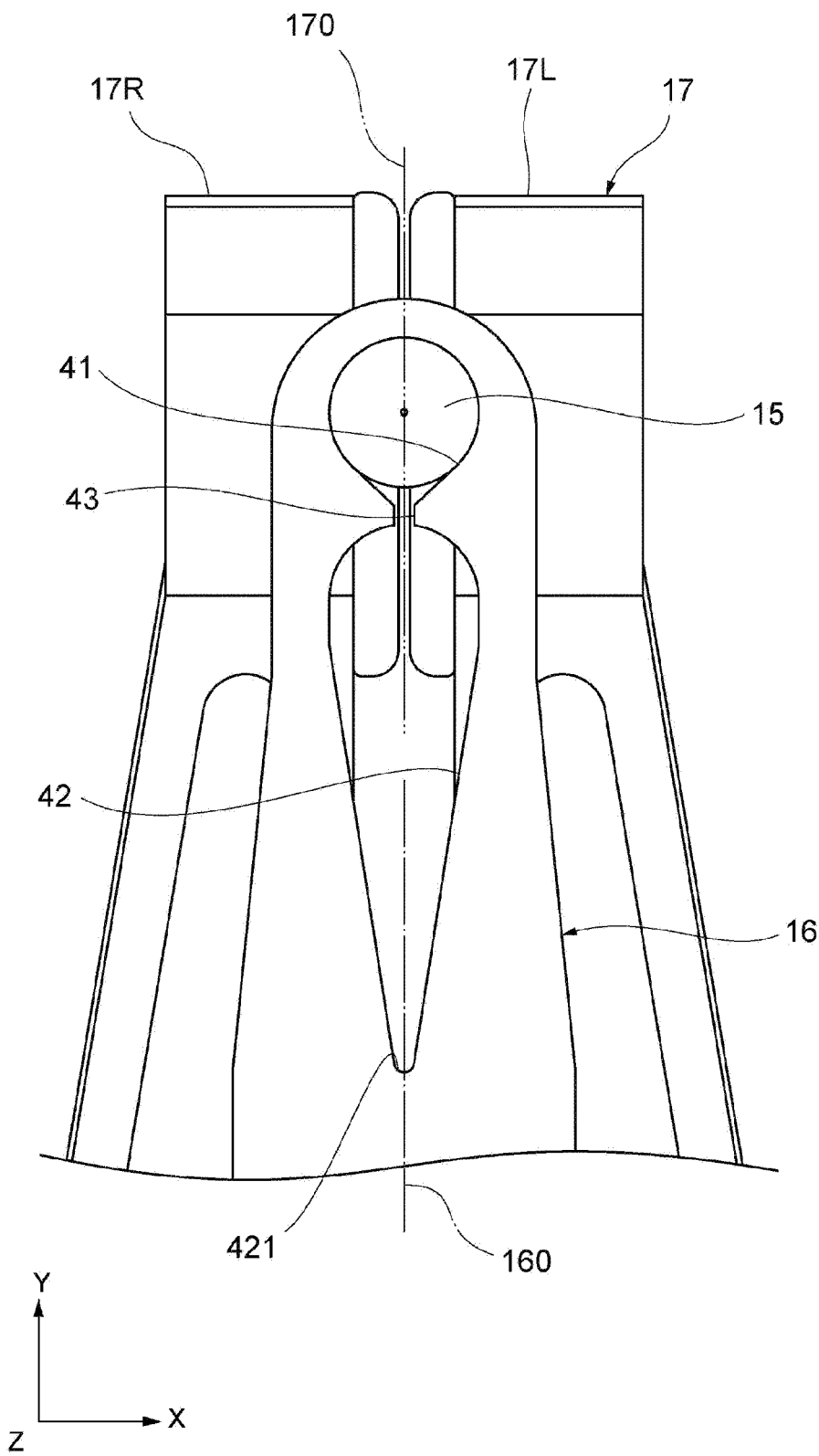
FIG. 3 is a bottom view of a tip portion of the horn shown in FIG. 2 as viewed from below in a vertical direction.

FIG. 3 is a bottom view of the tip portion of the horn 16 shown in FIG. 2 as viewed from below in the vertical direction. As shown in FIG. 3, a first through hole 41 and a second through hole 42 respectively penetrating the horn 16 are formed in the tip portion of the horn 16. The first through hole 41 is a holding hole for the capillary 15, and is formed in a circular shape conforming to an outer shape of the capillary 15.

The second through hole 42 is adjacent to the first through hole 41. The second through hole 42 is formed in a teardrop shape having a vertex 421 where the curvature is maximum. The first through hole 41 and the second through hole 42 are communicated with each other by a slit (bottleneck) 43. The slit 43 is located on a side opposite the vertex 421. The horn 16 is formed mirror-symmetrical with respect to a symmetry plane 160 that bisects the first through hole 41 and the second through hole 42. The symmetry plane 160 includes the center of the first through hole 41 and the vertex 421 of the second through hole 42.

Similarly, the clamper 17 is formed mirror-symmetrical with respect to a symmetry plane 170 of the clamper 17 that is equidistant from each of gripping surfaces of the pair of arms 17L and 17R gripping the wire 2. However, the clamper 17 is not limited to be mirror-symmetrical with respect to the symmetry plane 170, and arrangement of members such as a tightening screw may be different between the pair of arms 17L and 17R.

Figure 4:
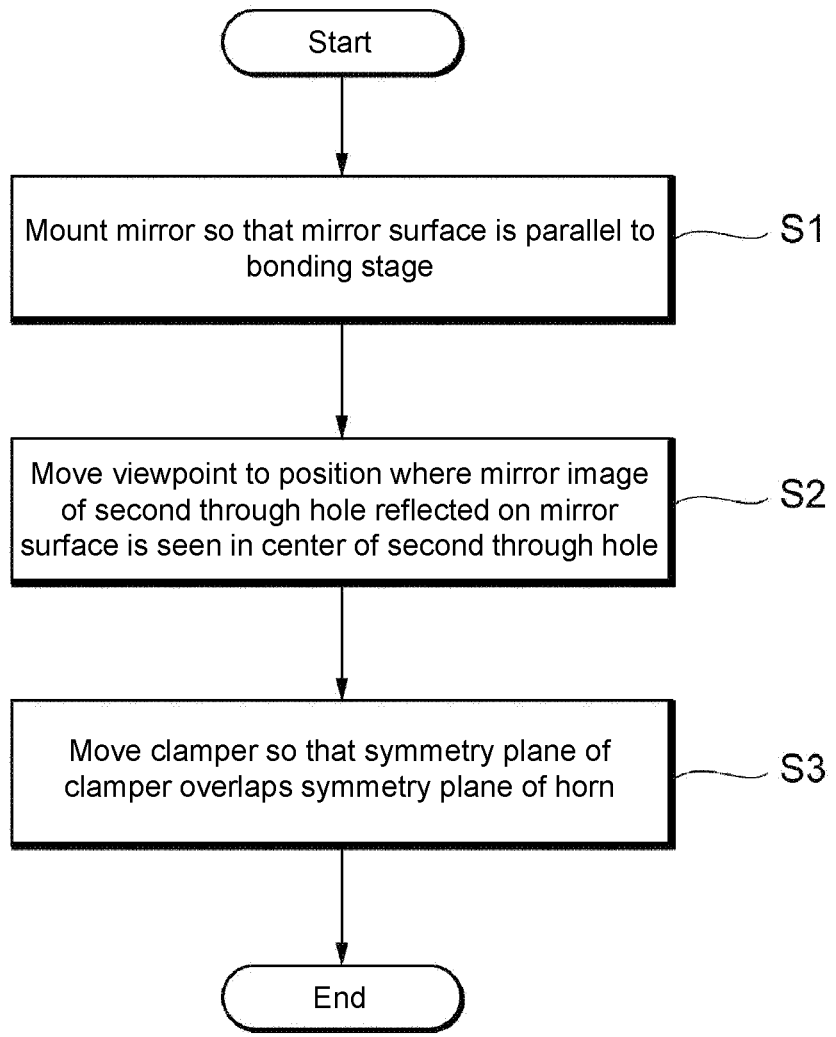
FIG. 4 is a flowchart showing an example of an alignment method according to the present invention.
Figure 5:
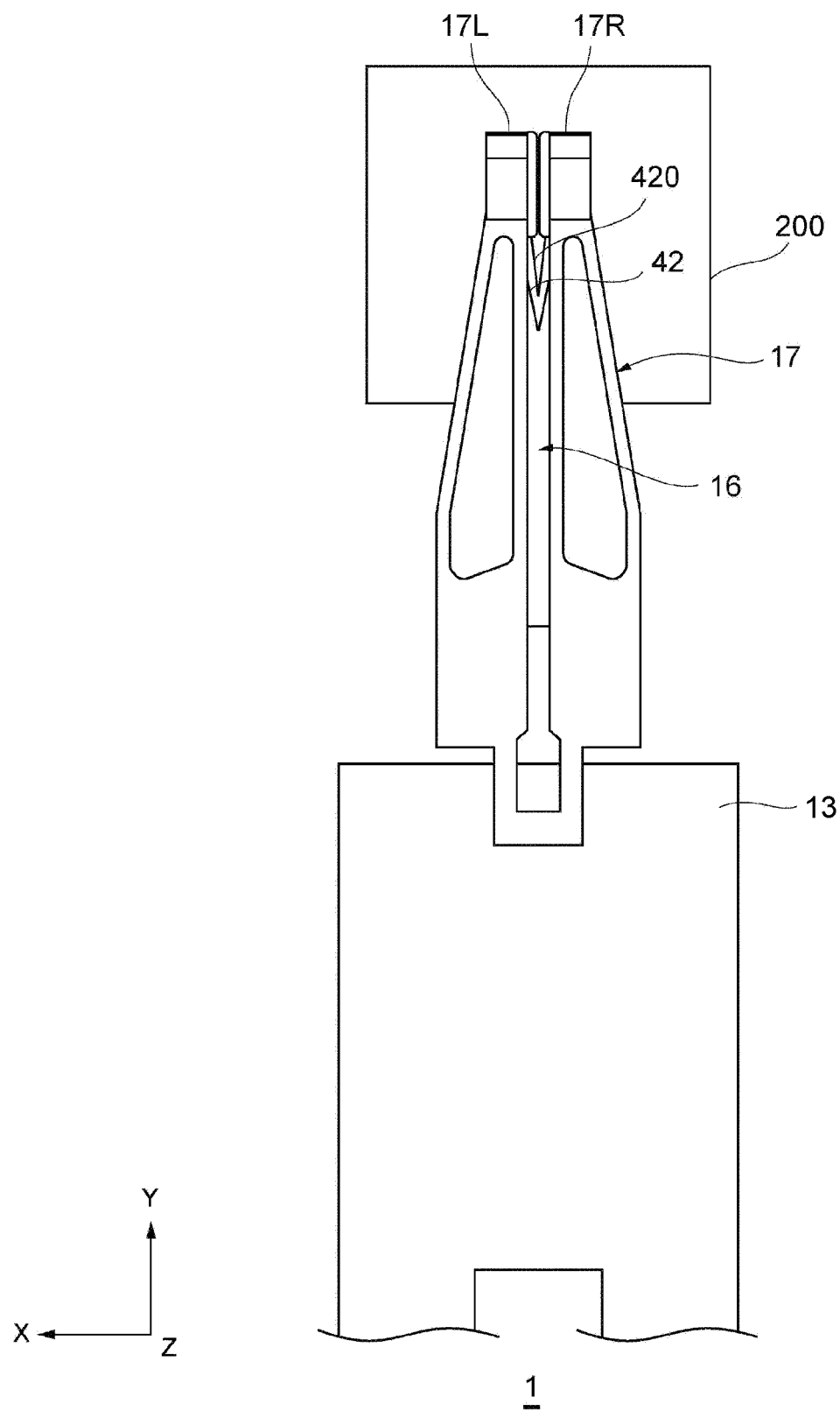
FIG. 5 is a plan view of the clamper shown in FIG. 2 as viewed from above in the vertical direction.
Figure 6:
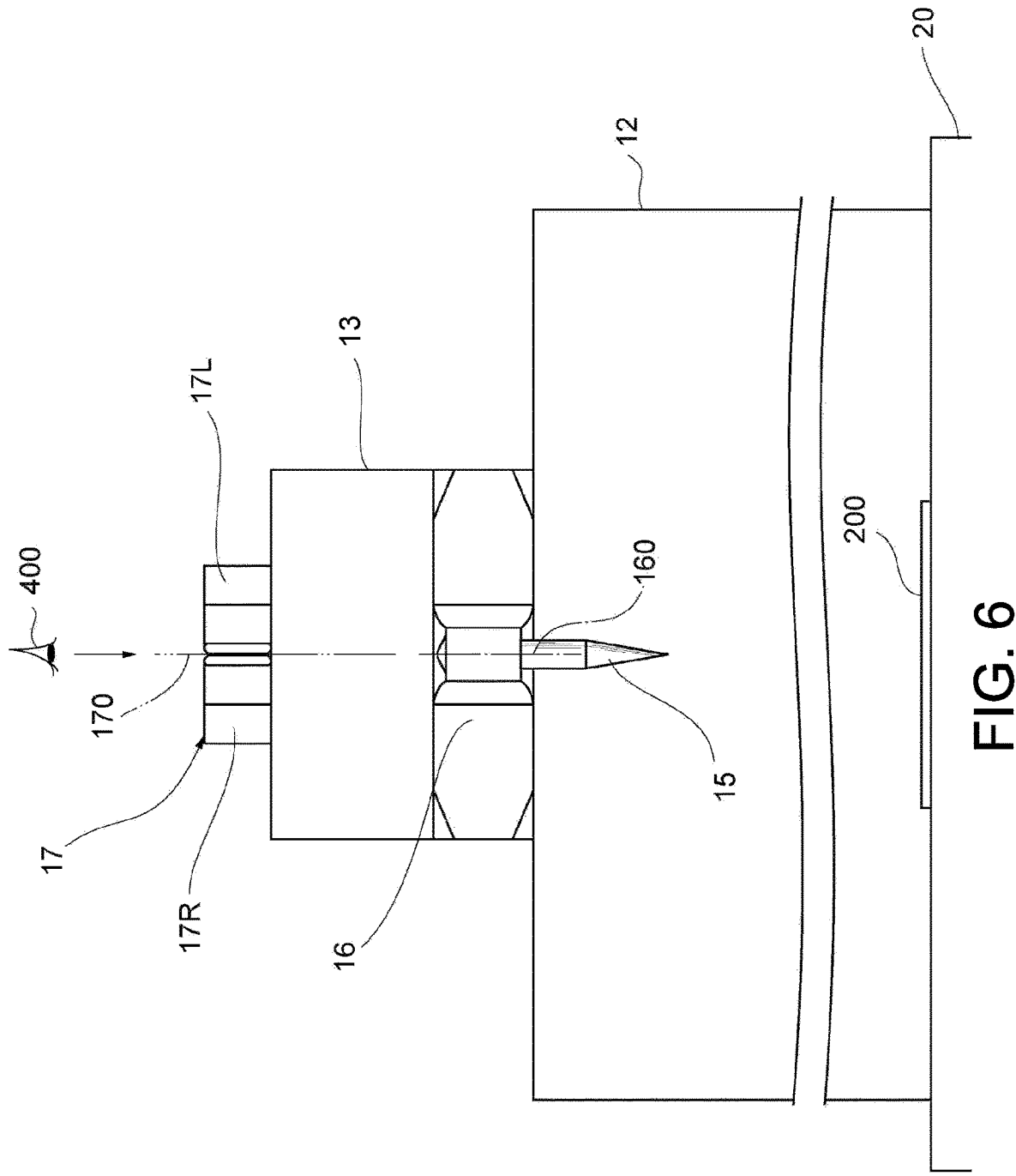
FIG. 6 is a front view of the horn and the clamper shown in FIG. 2 as viewed from a tip side.

Subsequently, an alignment method according to the present invention is described with reference to FIG. 4 to FIG. 6. FIG. 4 is a flowchart showing an example of an alignment method according to the present invention. FIG. 5 is a plan view of the clamper 17 shown in FIG. 2 as viewed from above in the vertical direction. FIG. 6 is a front view of the horn 16 and the clamper 17 shown in FIG. 2 as viewed from a tip side. In an alignment method according to the present invention, first, a mirror surface 200 is disposed to be parallel to the bonding stage 20 (step S1). The mirror surface 200 is not limited to a plane mirror shown in FIG. 6, and may be a plating film processed on the bonding stage 20 or the like. Examples of the mirror surface 200 include those having a function of a mirror surface.

Subsequently, as shown in FIG. 5, when the mirror surface 200 is viewed through the second through hole 42, a mirror image 420 of the second through hole 42 reflected on the mirror surface 200 is aligned with the center of the second through hole 42 (step S2). To align the mirror image 420, for example, a viewpoint 400 (shown in FIG. 6) may be moved to a position where the mirror image 420 is seen in the center of the second through hole 42. The terms "view" and "see" are not limited to visual observation and include capturing an object within an imaging range of a camera.

As shown in FIG. 6, in the alignment method according to the present invention, the clamper 17 is aligned based on positions of the mirror image 420 and the horn 16 (step S3). To align the clamper 17, for example, the clamper 17 may be moved so that the symmetry plane 170 of the clamper 17 overlaps the symmetry plane 160 of the horn 16 when viewed from the viewpoint 400.

The procedure of the alignment method described so far may be automatically performed by the control part 10 or may be manually performed by an operator. In the case where the control part 10 performs the aforesaid procedure, the bonding apparatus 1 may further include an actuator that moves the clamper 17.

According to the alignment method of each embodiment of the present invention, as shown in FIG. 6, in a direction perpendicular to the bonding stage 20, the mirror image 420 of the second through hole 42 reflected on the mirror surface 200, the second through hole 42, and the viewpoint 400 viewing the foregoing are arranged in a row. Since the symmetry plane 170 of the clamper 17 is moved so as to overlap the symmetry plane 160 of the horn 16 while maintaining this positional relationship, the horn 16 and the clamper 17 can be accurately aligned with each other. Since the second through hole 42 has a teardrop shape, the horn 16 and the clamper 17 can be relatively accurately aligned with each other with the vertex 421 as a mark.

The embodiments described above are for facilitating the understanding of the present invention rather than for limiting the interpretation of the present invention. Each element included in the embodiments and its arrangement, material, condition, shape, size, and the like are not limited to those illustrated and can be appropriately changed. It is possible to partially replace or combine the configurations shown in different embodiments.

What is claimed is:

1. An alignment method for aligning a horn and a clamper of a bonding apparatus with each other,
   the bonding apparatus comprising:
   the clamper, able to clamp a wire between a pair of arms;
   the horn, in which a first through hole able to hold a bonding tool, and a second through hole adjacent to the first through hole and penetrating the horn in an up-down direction are further formed; and
   a bonding stage, able to carry a workpiece,
   wherein the alignment method comprises:
   disposing a mirror surface to be parallel to the bonding stage;
   aligning a mirror image of the second through hole reflected on the mirror surface with a center of the second through hole when the mirror surface is viewed through the second through hole; and
   aligning the clamper based on a position of the mirror image and the horn.

2. The alignment method according to claim 1, wherein aligning the mirror image comprises moving a viewpoint to a position where the mirror image is seen in the center of the second through hole;
   aligning the clamper comprises moving the clamper so that, when viewed from the viewpoint, a symmetry plane of the clamper that is equidistant from each of the pair of arms overlaps a symmetry plane of the horn that bisects the first through hole and the second through hole.

3. The alignment method according to claim 2, wherein an opening of the second through hole has a teardrop shape having a vertex where a curvature is maximum;
   aligning the clamper comprises moving the clamper so that the symmetry plane of the clamper overlaps the vertex when viewed from the viewpoint.

4. A bonding apparatus, comprising:
   a clamper, able to clamp a wire between a pair of arms;
   a horn, in which a first through hole able to hold a bonding tool, and a second through hole adjacent to the first through hole and penetrating the horn in an up-down direction are further formed;
   a bonding stage, able to carry a workpiece; and
   a control part, performing alignment between the horn and the clamper, wherein
   the control part aligns a mirror image of the second through hole reflected on a mirror surface with a center of the second through hole when the mirror surface is viewed through the second through hole, the mirror surface being disposed to be parallel to the bonding stage, and
   the control part aligns the clamper based on a position of the mirror image and the horn.

* * * * *